(12) United States Patent  (10) Patent No.: US 8,570,091 B2
Lee et al.  (45) Date of Patent: Oct. 29, 2013

(54) LEVEL SHIFTER

(75) Inventors: Yeong-Sheng Lee, Fremont, CA (US); Kuangda Chu, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 34 days.

(21) Appl. No.: 13/315,685

(22) Filed: Dec. 9, 2011

(65) Prior Publication Data

US 2012/0169395 A1    Jul. 5, 2012

(30) Foreign Application Priority Data

Jan. 5, 2011    (TW) .............................. 100100286 A

(51) Int. Cl.
 *H03L 5/00*    (2006.01)
(52) U.S. Cl.
 USPC .......................................................... 327/333
(58) Field of Classification Search
 None
 See application file for complete search history.

(56) References Cited

U.S. PATENT DOCUMENTS 7,053,659 B2 *   5/2006   Livolsi et al. .................... 326/81
7,288,981 B2 *  10/2007   Short et al. ...................... 327/333
7,671,629 B2 *   3/2010   Zhang et al. ..................... 326/81

FOREIGN PATENT DOCUMENTS

CN          101174793         5/2008

OTHER PUBLICATIONS

English language translation of abstract of CN 101174793 (published May 7, 2008).

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

A level shifter, converting an input signal into an output signal for level shifting, including a leakage blocking circuit having cascaded P-channel transistors and one N-channel transistor. The P-channel transistor at a beginning stage provides a gate for receiving the input signal and a source coupled to a gate of the P-channel transistor at a secondary stage. At intermediate stages, each P-channel transistor provides a source coupled to a gate of the subsequently cascaded P-channel transistor. At a final stage, the P-channel transistor provides a source coupled to a voltage source and a drain coupled to an output terminal of the leakage blocking circuit for the outputting of the output signal. The N-channel transistor has a gate which is coupled to receive the input signal as well, a source coupled to a common voltage, and a drain coupled to the output terminal of the leakage blocking circuit.

18 Claims, 3 Drawing Sheets

LEVEL SHIFTER

CROSS REFERENCE TO RELATED APPLICATIONS

This Application claims priority of Taiwan Patent Application No. 100100286, filed on Jan. 5, 2011, the entirety of which is incorporated by reference herein.

BACKGROUND OF THE INVENTION

1. Field of the Invention

The present invention relates to a level shifter.

2. Description of the Related Art

In advanced IC design, the core logic and the I/O unit are powered by different voltage sources.

For example, in a 0.13 um process, the core logic is generally powered by a voltage source of 1.2V while the I/O unit is generally powered by another voltage source of 3.3V. Because the core logic works to be within a range of a first voltage range (e.g. 0-1.2V) and the I/O unit works to be within a range of a second voltage range (e.g. 0-3.3V), a level shifter is required between the core logic and the I/O unit to propagate signals correctly.

FIG. 1 depicts a conventional level shifter. The level shifter 100 comprises two inverters Inv1 and Inv2, a differential input pair 102 and a cross coupled pair 104. The input signal IN works to be within a range of a first voltage range. A first voltage source VDD that determines the first voltage range is operative to power both of the inverters Inv1 and Inv2. The inverters Inv1 and Inv2 output signals INb and IN', respectively, to be received by the differential input pair 102. As shown, the differential input pair 102 and the cross coupled pair 104 are powered by a second voltage source VCC to generate an output signal OUT. The generated output signal OUT works to be within a range of a second voltage range determined by the second voltage source VCC. To sum up, the level shifter 100 converts the input signal IN (to be within a range of the first voltage range) into the output signal OUT (to be within a range of the second voltage range) for level shifting of the propagating signals between two units powered by distinct voltage sources.

The conventional level shifter 100, however, has to refer to the voltage source (i.e. the first voltage source VDD) of a preceding unit as well as the voltage source (i.e. the second voltage source VCC) of a succeeding unit, and contains transistors of various oxide thicknesses (depending on the voltage sources coupled thereto). Thus, additional design complexity is required. Furthermore, the conventional level shifter 100 uses a positive feedback design, which results in slow performance of the differential input pair 102 and the cross coupled pair 104 and there is a considerable delay between the input signal IN and the output signal OUT. Furthermore, the variations in the dimensions of the transistors of the differential input pair 102 or the cross coupled pair 104 may result in a considerable mismatch between the rising time and the falling time of the output signal OUT of the level shifter 100.

Thus, an accurate, high-transition speed and small-sized level shifter is called for.

BRIEF SUMMARY OF THE INVENTION

A level shifter is disclosed, which converts an input signal to be within a range of a first voltage range into an output signal to be within a range of a second voltage range.

A level shifter in accordance with an exemplary embodiment of the invention includes a leakage current blocking circuit. The leakage current blocking circuit has an input terminal coupled to receive the input signal and an output terminal coupled to provide the output signal. The leakage current blocking circuit comprises cascaded P-channel transistors and an N-channel transistor. The P-channel transistor at a beginning stage has a gate which is coupled to receive the input signal and a source coupled to a gate of the P-channel transistor at a secondary stage. At intermediate stages, each P-channel transistor has a source coupled to a gate of the subsequently cascaded P-channel transistor. At a final stage, the P-channel transistor has a source coupled to a voltage source, and a drain coupled the output terminal of the leakage current blocking circuit. As for the N-channel transistor, it has a gate which is coupled to receive the input signal, a source coupled to a common voltage, and a drain coupled to the output terminal of the leakage current blocking circuit.

In another embodiment, a level shifter includes a first P-channel transistor, a second P-channel transistor and an N-channel transistor. The first P-channel transistor has a gate which is coupled to receive the input signal, a drain coupled to a common voltage, and a source. The second P-channel transistor has a gate coupled to the source of the first P-channel transistor, a source coupled to a voltage source and a drain. The N-channel transistor has a gate which is coupled to receive the input signal, a drain coupled to the drain of the second P-channel transistor and a source coupled to the common voltage. Both the drain of the second P-channel transistor and the drain of the first N-channel transistor are coupled together to provide the output signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following descriptions illustrate several exemplary embodiments carrying out the invention. This description is made for the purpose of illustrating the general principles of the invention and should not be taken in a limiting sense. The scope of the invention is best determined by reference to the appended claims.

Figure 2:
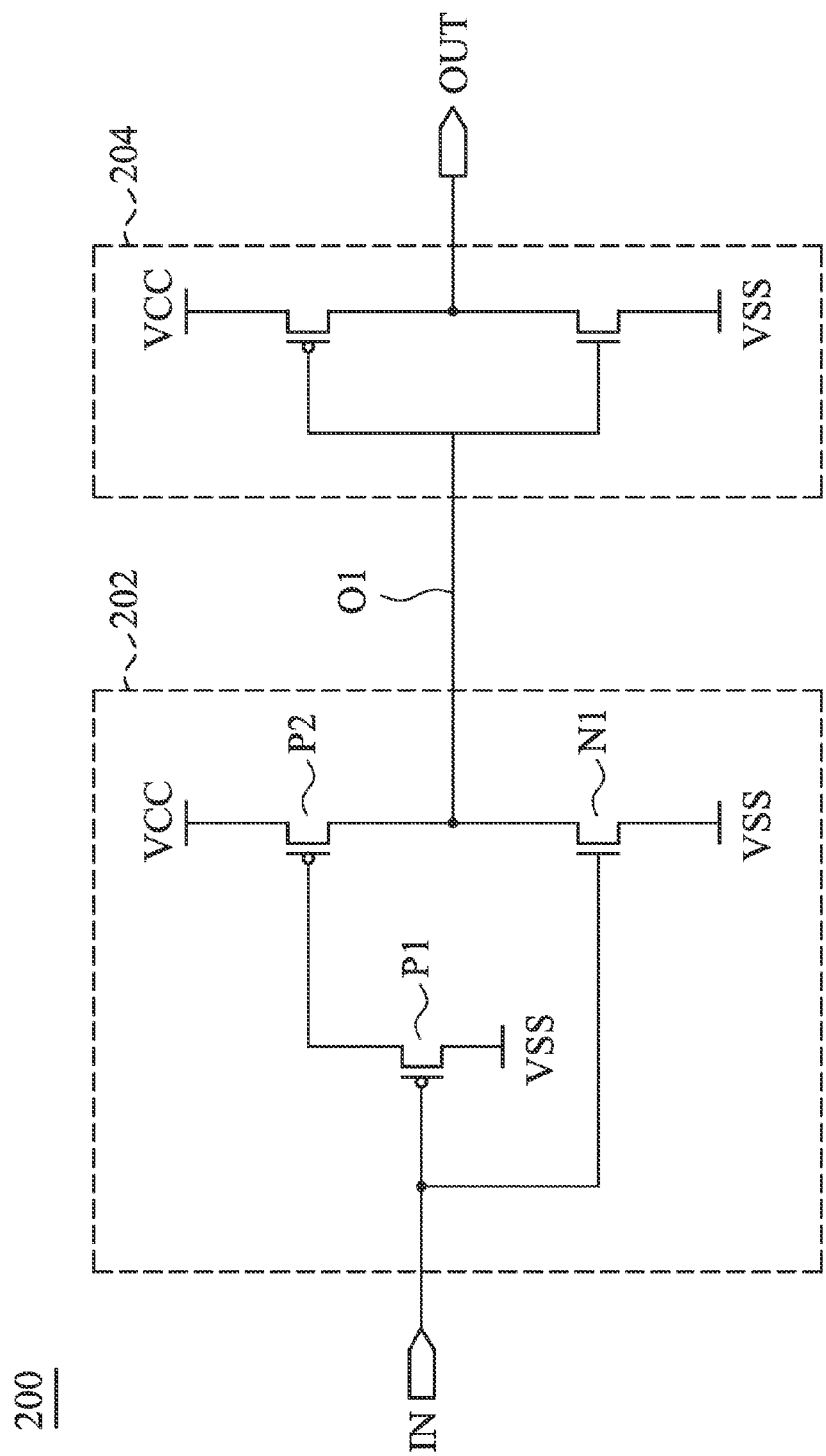
FIG. 2 illustrates a level shifter in accordance with an exemplary embodiment of the invention.

FIG. 2 illustrates a level shifter in accordance with an exemplary embodiment of the invention.

The level shifter 200 includes a leakage current blocking circuit 202 and an inverter 204, and is operative to convert an input signal IN (to be within a range of a first voltage range) into an output signal OUT (to be within a range of a second voltage range). The first voltage range may be bounded between a common voltage VSS and a first voltage source VDD, where the first voltage source VDD is operative to power a preceding unit that provides the input signal IN. The second voltage range may be bounded between the common voltage VSS and a second voltage range VCC, where the second voltage source VCC is operative to power a subsequent unit that receives the output signal OUT. In an exemplary embodiment, the voltage level of the second voltage source VCC may be greater than that of the first voltage source VDD.

The leakage current blocking circuit 202 has an input terminal receiving the input signal IN and has an output terminal at which an intermediate signal O1 is provided. The leakage current blocking circuit 202 is powered by the second voltage source VCC. The inverter 204 is powered by the second voltage source VCC, too. As shown, the inverter 204 inverts the received intermediate signal O1 to generate the output signal OUT. For simplicity, hereinafter the input terminal of the leakage current blocking circuit 202 has the same marking as the input signal IN, and the output terminal of the leakage current blocking circuit 202 has the same marking as the intermediate signal O1.

The leakage current blocking circuit 202 provides cascaded P-channel transistors (e.g. the P-channel transistors P1 and P2) between the input terminal IN and the second voltage source VCC to deploy a plurality of P-channel transistor gate-source junctions between the input terminal IN and the second voltage source VCC. At the final stage, the P-channel transistor (e.g. the second P-channel transistor P2 of FIG. 2) provides a drain which is coupled to the output terminal O1 of the leakage current blocking circuit 202.

In addition to the cascaded P-channel transistors, the leakage current blocking circuit 202 further comprises an N-channel transistor (e.g. N1) which provides a gate which is coupled to receive the input signal IN, a source coupled to the common voltage VSS, and a drain coupled to the output terminal O1 of the leakage current blocking circuit 202.

This paragraph details the connections between the transistors of the leakage current blocking circuit 202 of FIG. 2, which includes a first P-channel transistor P1, a second P-channel transistor P2 and an N-channel transistor N1. The first P-channel transistor P1 has a gate which is coupled to receive the input signal IN, a drain coupled to the common voltage VSS, and a source. The second P-channel transistor P2 has a gate coupled to the source of the first P-channel transistor P1, a source coupled to the second voltage source VCC, and a drain. The N-channel transistor N1 has a gate which is coupled to receive the input signal IN, a drain coupled to the drain of the second P-channel transistor P2, and a source coupled to the common voltage VSS. The drain of the second P-channel transistor P2 and the drain of the N-channel transistor N1 are coupled together to provide the intermediate signal O1 to be received by the inverter 204 for the generation of the output signal OUT.

Therefore, when the input signal IN is low, the plurality of P-channel transistors (in FIG. 2, including P1 and P2) are all turned on. The electrical connection provided by the final one of the plurality of P-channel transistors (e.g. P2 of FIG. 2) couples the output terminal O1 to the second voltage source VCC, so that the intermediate signal O1 is pulled up to the voltage level of the second voltage source VCC. By the inverter 204, the logic high intermediate signal O1 is inverted so that the output signal OUT is pulled down to the common voltage VSS.

When the input signal IN is high (e.g., at the voltage level of the first voltage source VDD), the voltage difference between the input signal IN and the second voltage source VCC is too weak to turn on the plurality of P-channel transistors (in FIG. 2, including P1 and P2) cascaded therebetween. Therefore, the P-channel transistors P1 and P2 of FIG. 2 are completely turned off when the input signal IN is high (at the voltage level of VDD), and the leakage current therethrough is effectively blocked. Meanwhile, the N-channel transistor N1 is turned on by the logic high input signal IN to couple the output terminal O1 of the leakage current blocking circuit 202 to the common voltage VSS. By the inverter 204, the logic low (at VSS) intermediate signal O1 is inverted so that the output signal OUT is pulled high to the voltage level of the second voltage source VCC.

Figure 3:
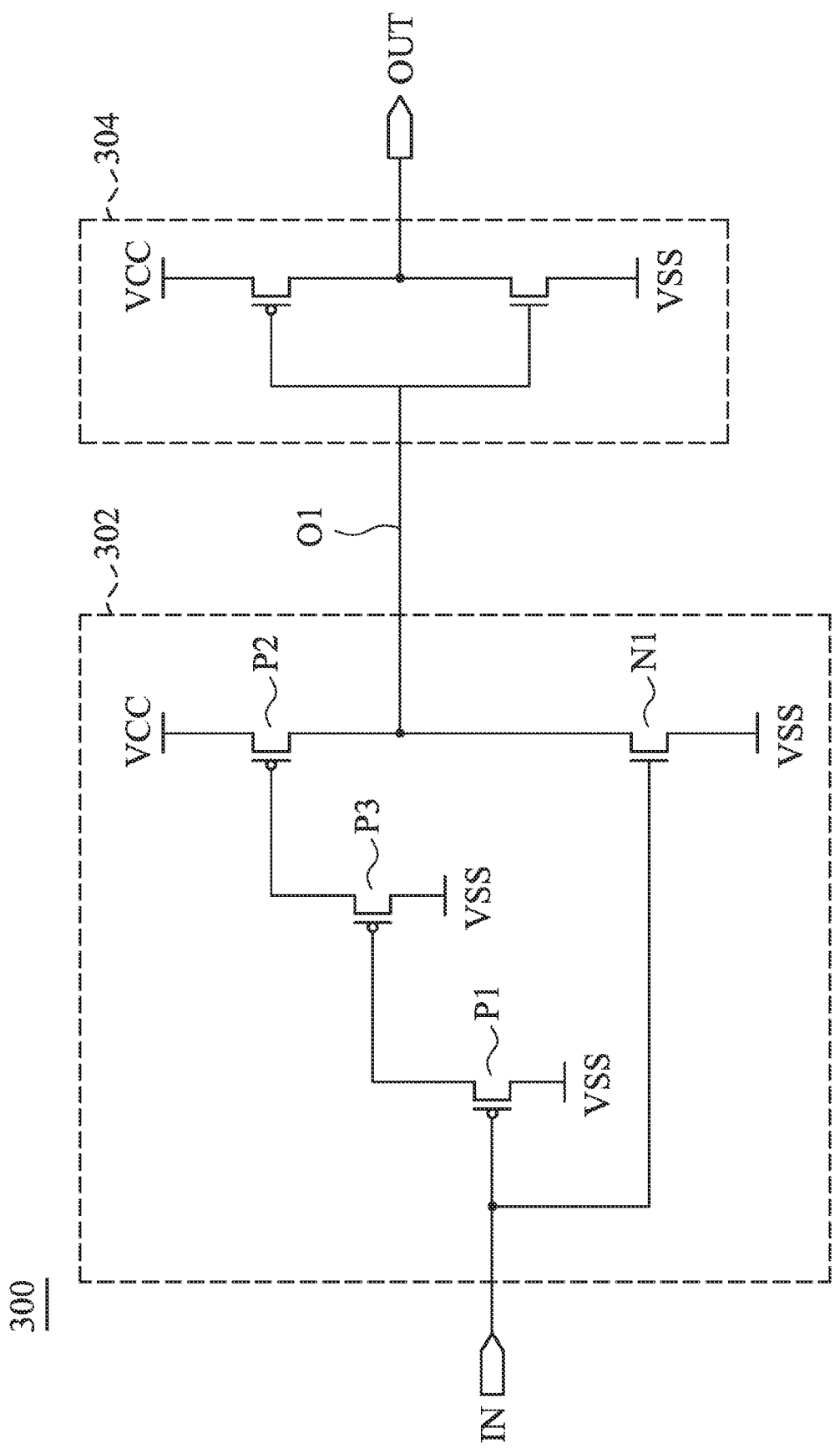
FIG. 3 depicts a level shifter having one more P-channel transistor in comparison with that of FIG. 2.

Note that the greater the voltage difference between the first voltage source VDD and the second voltage source VCC is, the more P-channel transistors are required between the input terminal IN and the second voltage source VCC. FIG. 3 depicts a level shifter 300 having one more P-channel transistor in comparison with that of FIG. 2. In comparison with the leakage current blocking circuit 202 of FIG. 2, an additional P-channel transistor P3 is used in the leakage current blocking circuit 302 of FIG. 3 to cope with greater voltage differences between the first voltage source VDD and the second voltage source VCC.

Figure 1:
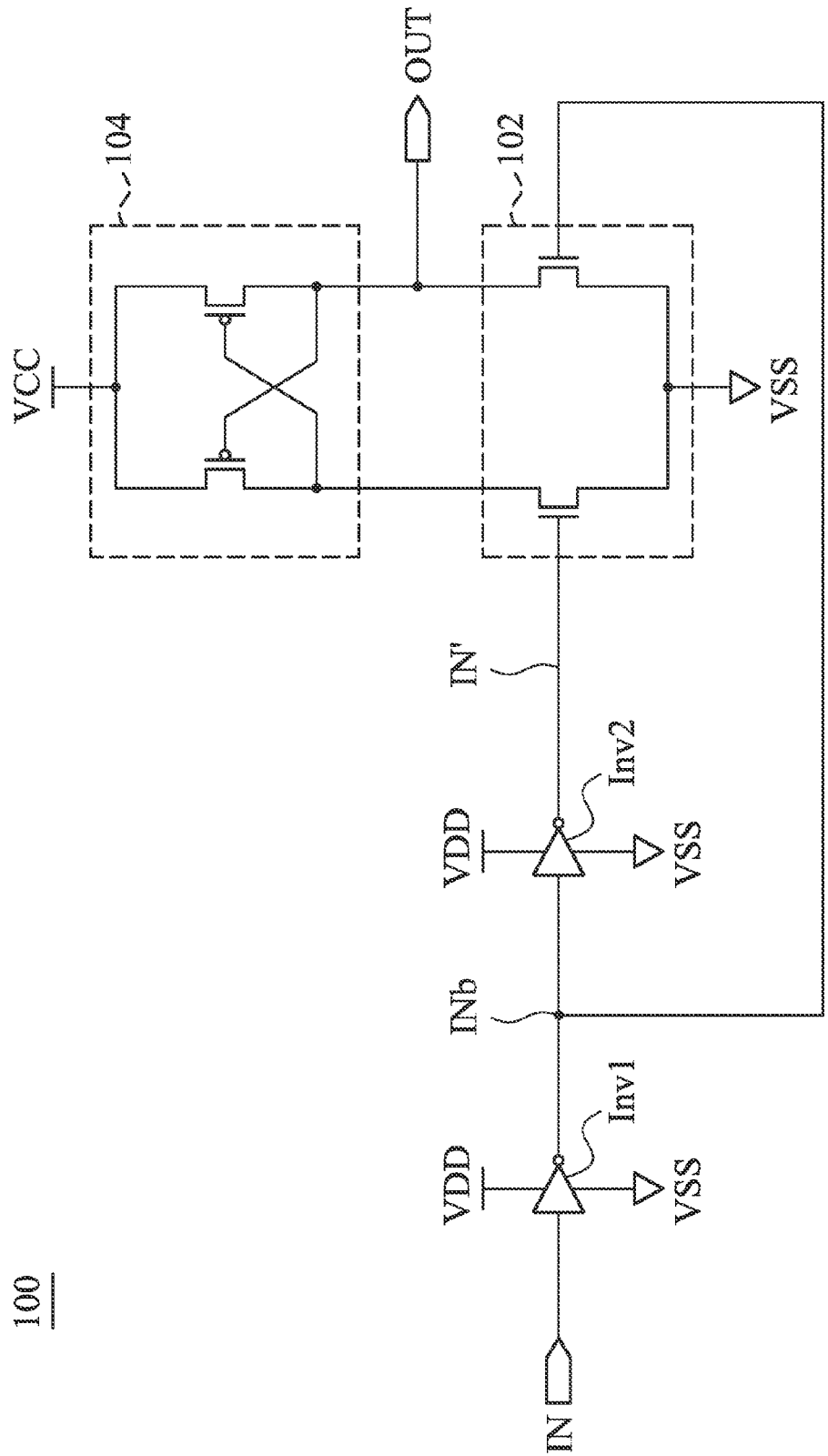
FIG. 1 depicts a conventional level shifter.

The disclosed level shifter successfully converts an input signal IN to be within a range of a first voltage range (VSS to VDD) into an output signal OUT to be within a range of a second voltage range (VSS to VCC). Note that only one single voltage source (the second voltage source VCC) is required to power the disclosed level shifter. In comparison with the conventional level shifter 100 of FIG. 1 that is powered by two voltage sources (including VDD and VCC both), the circuit design of the disclosed level shifter is much simpler. Furthermore, the positive feedback design of the conventional level shifter 100 of FIG. 1 is not adopted in the disclosed level shifter, so that the disclosed level shifter reacts fast. The output signal OUT is capable of immediately responding to the transition of the input signal IN. Furthermore, in comparison with the conventional level shifter 100 that may be formed by mismatched transistors of the differential input pair 102 or the mismatched cross coupled pair 104, the mismatch between the low-to-high transition and the high-to-low transition of the output signal OUT is not contained in the disclosed level shifter.

Referring to the circuits of FIG. 2 and FIG. 3, the leakage current blocking circuits 202 and 302 are purely driven by one single voltage source VCC and an additional bias circuit is not required. Thus, the circuit design is simple. Please note that associated manufacturing processes and/or masks of fabricating the disclosed level shifter circuit may be fewer than that of conventional skills because only single voltage source VCC is needed therein, which also indicates that there may be an easy way of manufacturing the disclosed level shifter circuit than the conventional.

Note that the circuits disclosed in FIG. 2 and FIG. 3 are not intended to limit the number of P-channel transistors and N-channel transistors used in the leakage current blocking circuit. The actual amount of the P-channel transistors and the N-channel transistors should depend on the application of the level shifter.

Note that the circuits of the inverters 204 and 304 of FIGS. 2 and 3 may be replaced by other well-known inverter circuits.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter converting an input signal to be within a range of a first voltage range into an output signal to be within a range of a second voltage range, comprising:

a leakage blocking circuit, having an input terminal coupled to receive the input signal and an output terminal coupled to provide the output signal, comprising:
a plurality of first-type-channel transistors that are cascaded, wherein the first-type-channel transistor at a beginning stage has a gate which is coupled to receive the input signal and a source directly connected to a gate of the first-type-channel transistor at a secondary stage, and, at each intermediate stage, each first-type-channel transistor has a source directly connected to a gate of a subsequently cascaded first-type-channel transistor, and, the first-type-channel transistor at a final stage has a source coupled to a voltage source and a drain coupled to the output terminal of the leakage blocking circuit; and
a second-type-channel transistor, having a gate which is coupled to receive the input signal, a source coupled to a common voltage, and a drain coupled to the output terminal of the leakage current block circuit,
wherein every one of the first-type-channel transistors except for the one at the final stage has a drain directly connected to the common voltage.

2. The level shifter as claimed in claim 1, further comprising:
an inverter, powered by the voltage source, and having an input terminal coupled to the output terminal of the leakage current blocking circuit and an output terminal coupled to provide the output signal.

3. The level shifter as claimed in claim 1, wherein the voltage source determines the second voltage range.

4. The level shifter as claimed in claim 1, wherein the second voltage range has an upper limit higher than that of the first voltage range.

5. The level shifter as claimed in claim 1, wherein the common voltage is common ground.

6. A level shifter converting an input signal to be within a range of a first voltage range into an output signal to be within a range of a second voltage range, comprising:
a first first-type-channel transistor, having a gate which is coupled to receive the input signal, a drain directly connected to a common voltage, and a source;
a second first-type-channel transistor, having a gate directly connected to the source of the first first-type-channel transistor, a source coupled to a voltage source, and a drain; and
a second-type-channel transistor, having a gate which is coupled to receive the input signal, a drain coupled to the drain of the second first-type-channel transistor and a source coupled to the common voltage,
wherein both the drain of the second first-type-channel transistor and the drain of the second-type-channel transistor are coupled together to provide the output signal.

7. The level shifter as claimed in claim 6, further comprising:
an inverter, powered by the voltage source, having an input terminal coupled to the drains of the second first-type-channel transistor and the second-type-channel transistor, and having an output terminal at which the output signal is provided.

8. The level shifter as claimed in claim 6, wherein the voltage source determines the second voltage range.

9. The level shifter as claimed in claim 6, wherein the second voltage range has an upper limit higher than that of the first voltage range.

10. The level shifter as claimed in claim 6, wherein the common voltage is common ground.

11. A leakage blocking circuit converting an input signal bounded between a first voltage range into an output signal bounded between a second voltage range, comprising:
a plurality of cascade first-type-channel transistors, a gate of a first transistor of the cascade first-type-channel transistors is configured to receive the input signal; and
a second-type-channel transistor, a gate of the second-type-channel transistor is configured to receive the input signal, and a drain of the second-type-channel transistor is configured to couple with a drain of a last transistor of the cascade first-type-channel transistors to generate the output signal;
wherein every one of the cascade first-type-channel transistors except for the last transistor of the cascade first-type-channel transistors has a drain directly connected to a common voltage.

12. The leakage blocking circuit as claimed in claim 11, wherein an inverter powered by a same voltage source with the leakage blocking circuit is configured to receive the output signal from the leakage blocking circuit and to provide an output signal of a level shifter.

13. The leakage blocking circuit as claimed in claim 11, wherein a voltage source powering the leakage blocking circuit determines the second voltage range and the second voltage range has an upper limit higher than that of the first voltage range.

14. The leakage blocking circuit as claimed in claim 11, wherein a drain of a preceding transistor of the cascade first-type-channel transistors is configured to couple with a gate of a following transistor of the cascade first-type-channel transistors.

15. The level shifter as claimed in claim 1, where the number of the intermediate stages of the first-type-channel transistors between the beginning stage and the final stage is larger than one.

16. The level shifter as claimed in claim 1, wherein the gate of the first-type-channel transistor at the final stage is purely connected to the source of the first-type-channel transistor at a preceding stage prior to the final stage without directly connecting to other transistors.

17. The level shifter as claimed in claim 6, wherein the gate of the second first-type-channel transistor is purely connected to the source of the first first-type-channel transistor without directly connecting to other transistors.

18. The level shifter as claimed in claim 11, wherein a gate of the last transistor of the cascade first-type-channel transistors is purely connected to a source of a preceding transistor prior to the last transistor in the cascade first-type-channel transistors without directly connecting to other transistors.

* * * * *